United States Patent [19]
Lake et al.

[11] Patent Number: 5,480,834
[45] Date of Patent: Jan. 2, 1996

[54] PROCESS OF MANUFACTURING AN ELECTRICAL BONDING INTERCONNECT HAVING A METAL BOND PAD PORTION AND HAVING A CONDUCTIVE EPOXY PORTION COMPRISING AN OXIDE REDUCING AGENT

[75] Inventors: Rickie C. Lake, Eagle; Mark E. Tuttle, Boise, both of Id.

[73] Assignee: Micron Communications, Inc., Boise, Id.

[21] Appl. No.: 166,747

[22] Filed: Dec. 13, 1993

[51] Int. Cl.⁶ .......................... H01L 21/288; H01L 21/60
[52] U.S. Cl. ........................ 437/183; 228/180.22
[58] Field of Search ............... 437/183; 228/180.22; 257/737, 738, 746, 778, 780, 783

[56] References Cited

U.S. PATENT DOCUMENTS

| | | | |
|---|---|---|---|
| 3,871,014 | 3/1975 | King et al. ................................. | 357/67 |
| 3,871,015 | 3/1975 | Lin et al. .................................... | 357/67 |
| 4,582,724 | 4/1986 | Cooper ..................................... | 427/125 |
| 5,029,585 | 7/1991 | Lieber et al. ............................ | 428/642 |
| 5,196,371 | 3/1993 | Kulesza et al. ......................... | 437/183 |
| 5,384,284 | 1/1995 | Doan et al. .............................. | 437/190 |

FOREIGN PATENT DOCUMENTS 63-276237  11/1988  Japan .

OTHER PUBLICATIONS

Tummala, Rao R. & Rymaszewski, Eugene J., "Microelectronics Packaging Handbook", Jan. 1, 1989, pp. 366–391, Van Nostrand Reinhold.

*Primary Examiner*—George Fourson
*Assistant Examiner*—David E. Graybill
*Attorney, Agent, or Firm*—Wells, St. John, Roberts, Gregory & Matkin

[57] ABSTRACT

A process for manufacturing a low contact resistance electrical bonding interconnect having a metal bond pad portion and conductive epoxy portion. The conductive epoxy portion comprises a metal oxide reducing agent for reducing oxides formed during the fabrication of the bonding interconnect.

3 Claims, 1 Drawing Sheet

5,480,834

PROCESS OF MANUFACTURING AN ELECTRICAL BONDING INTERCONNECT HAVING A METAL BOND PAD PORTION AND HAVING A CONDUCTIVE EPOXY PORTION COMPRISING AN OXIDE REDUCING AGENT

FIELD OF THE INVENTION

The invention relates to semiconductor flip chip technology and more particularly to conductive epoxy attachment of a die pad to a supporting substrate.

BACKGROUND OF THE INVENTION

Flip chip interconnections made to connect a semiconductor die pad circuit to a semiconductor supporting substrate have historically been made with exotic plating methods and reflow solder attachment. More recently electrically conductive epoxy has been used to make the flip chip interconnections. These conductive epoxy interconnects have typically been plagued with high contact resistance. For example, when used to contact an aluminum bond pad, which is the semiconductor industry standard, a tenacious nonconductive oxide coated surface forms in a short amount of time, even at room temperature. Because of the nonconductive oxides present, electrically conductive epoxies on otherwise bare aluminum form an interconnect having an extremely high contact resistance. The resistance typically ranges from hundreds of ohms to millions of ohms.

In an effort to reduce the contact resistance a more noble metal, such as gold, has been used to provide a very inert, oxide free surface over which the conductive epoxy may be applied. Gold precludes the formation of nonconductive metal oxides at the surface of the contact. Thus gold, plated on an existing contact, has a direct low contact resistance when it is bonded with a conductive epoxy. However the gold plating of a semiconductor die pad is an elaborate process that can be very difficult, expensive and time consuming. It is very difficult because the process is typically not an electroless deposition process and therefore requires the substrates to be electrically connected to a power supply.

In another method to reduce the contact resistance the oxide formed during the epoxy application is mechanically removed, typically with abrasive action. In a further method the base metal is subjected to a chemical pre-treatment to prohibit oxide formation.

Therefore there exists a need for a flip-chip surface mount device wherein a supporting substrate and a die pad are epoxy bonded efficiently with a low contact resistance.

SUMMARY OF THE INVENTION

The invention is a bonding interconnect comprising a bond pad portion and a conductive epoxy portion. The conductive epoxy portion comprises an oxide reducing agent which reduces oxides formed on the bond pad. The conductive epoxy is cured to bond the epoxy to the plated portion.

The bonding interconnect of the invention has a low contact resistance and creates a good electrical interconnect to bond a die pad to a supporting substrate.

DETAILED DESCRIPTION OF THE INVENTION

The invention is an inexpensive low contact resistance electrical bonding interconnect and the method of forming the bonding interconnect. The bonding interconnect comprises a metal bond pad portion and a conductive epoxy portion. The conductive epoxy portion comprises a metal oxide reducing agent for reducing oxides formed on the metal bond pad.

The following description describes the electrical bonding interconnect and method of forming the electrical bonding interconnect.

Figure 1A:
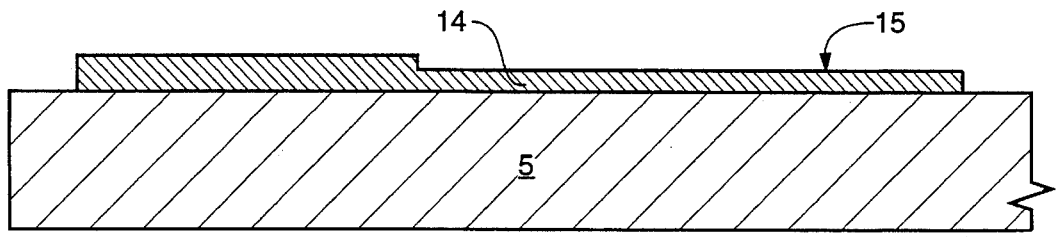
FIG. 1A is a supporting substrate having a circuit trace.
Figure 1B:
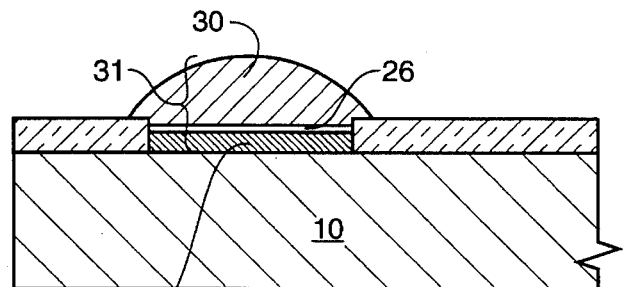
Figure 1B depicts a die pad having a copper plated bond pad bonded to conductive epoxy.

FIG. 1A depicts a supporting substrate 5, and FIG. 1B depicts a die pad 10. The die pad 10 typically consists of circuitry fabricated on a semiconductor substrate. The supporting substrate 5 is fabricated to have a circuit trace 14. The circuit trace 14 may be fabricated using any circuit trace technology including, but not limited to copper, aluminum, printed polymer thick film (copper, silver, or carbon) technologies. A portion of the circuit trace 14 is an electrical contact area 15.

The die pad 10 is fabricated to have an electrical contact area 20. The contact area 20 is also referred to as a bond pad. Because of practical manufacturing considerations the contact area 20 of the present embodiment is aluminum, although other conductive metals may be used.

The exposed aluminum on the die pad 10 is electroless copper plated to form a copper layer 26. Electroless copper plating is well known to those skilled in the art. Although copper is the metal of choice in the preferred embodiment other conductive metals may be used in place of copper.

In the present embodiment a conductive epoxy 30 is formulated to have a copper oxide reducing agent and is applied to the copper layer 26 overlying contact area 20. The copper layer 26 forms an interface layer on the aluminum contact area 20 in order to provide a desired surface for the conductive epoxy 30. In this embodiment the copper layer 26 and the contact area 20 form the metal bond pad portion and the conductive epoxy 30 forms the conductive epoxy portion of the electrical bonding interconnect 31. The epoxy is cured to harden it and increase the adhesive bond between the conductive epoxy 30 and the copper layer 26, thereby completing the fabrication of the electrical bonding interconnect.

A wide variety of metal oxide reducing agents are compatible with the epoxy used in the epoxy industry, including, but not limited to, alkoxylated polyalkyl amine and ethylene diamine. One example of an epoxy containing a curing agent which is also a copper oxide reducing agent that was found to have a very low contact resistance is manufactured by Tra-Con, Incorporated located at 55 North Street, Medford, Mass., 02155. The specific material was Tra-Con hardener "Tra-Duct 2922 Hardener", containing in significant part polyalkyl amine and ethylene diamine. Other epoxies contain curing agents which are not oxide reducing agents, and accordingly were ineffective in reducing copper oxide. One example of an ineffective material, having no alkoxylated polyalkyl amine or ethylene diamine, is "Ablebond 8380" manufactured by Ablestik located at 20021 Suzana Road, Rancho Dominguez, Calif.

If a metal other than copper is plated onto the contact area 20, the oxide reducing agent in the conductive epoxy is selected to reduce the oxides formed before and/or during the process of the invention.

In one method the conductive epoxy portion 30 is applied to the die pad by placing a screen over the die pad 10 and over the copper layer 26. Correct positioning of the screen aligns a screen opening with the contact area 20. The screen opening is filled with the conductive epoxy and excess epoxy is removed. The screen is then removed and the conductive epoxy portion 30 overlying the contact area 15 remains.

Figure 2:
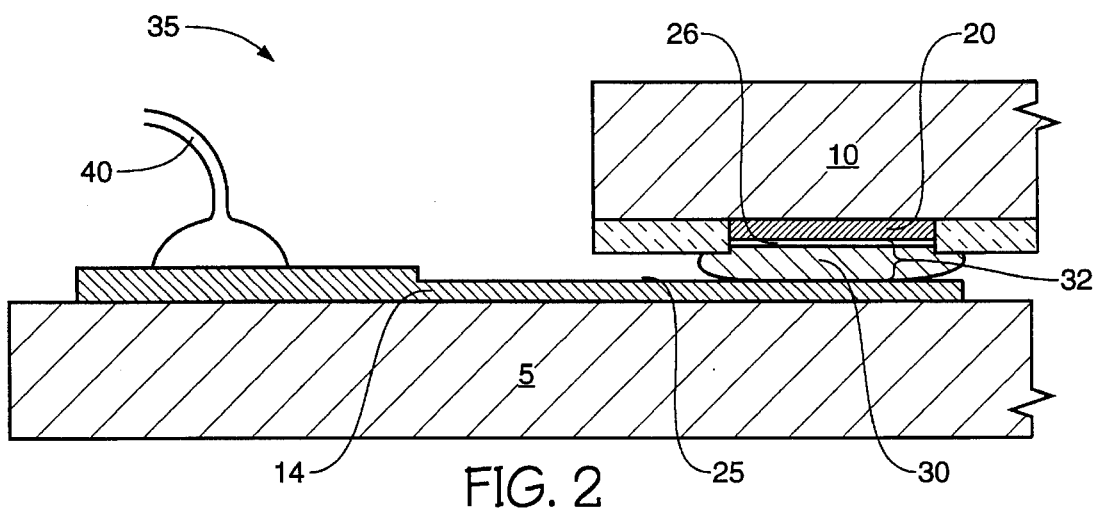
FIG. 2 depicts a memory module comprising the supporting substrate and die pad of FIG. 1.

The process can be continued to form a memory module 35 shown in FIG. 2. In one embodiment a small amount of liquid conductive epoxy is applied to the contact area 15 of the substrate 5. The die pad 10 is positioned over the supporting substrate 5 such that the contact areas 15 and 20 are aligned. The cured epoxy functions as a standoff between the die pad 10 and substrate 5. The wet epoxy is then cured, bonding the die pad 10 and the substrate 5 together. A wire bond 40 may be used to electrically connect the supporting substrate to an external electrical connection.

Although the bonding pad of the described embodiment comprises a first conductive layer and a plated layer the invention is equally applicable in the case where the conductive epoxy is applied to a conductive layer which is not plated.

Since the oxides formed on the copper are reduced by the method of the invention the contact resistance between the epoxy and the copper is reduced, and consequently there is a low contact resistance between the epoxy and copper. Thus an effective method has been developed to inexpensively and efficiently provide a low contact resistance electrical interconnect.

Although the invention has been described in terms of forming an electrical bonding interconnect on a die pad, the circuit and method of the invention have utility in other circuits where an electrical interconnect is desired. Accordingly the invention should be read as limited only by the claims.

What is claimed is:

1. A method of forming an electrical bonding interconnect to a substrate comprising the following steps:

providing an electrically conductive metal contact area on a substrate;

exposing the metal contact area to conditions effective to reactively form an electrically resistive metal oxide material from the metal;

applying an electrically conductive epoxy over the electrically resistive oxide material, the epoxy comprising a reducing agent effective to reduce the metal oxide back to conductive metal;

reducing the metal oxide back to conductive metal using the reducing agent present in the conductive epoxy; and curing the conductive epoxy into a conductive hardened material to form a conductive interconnect between the epoxy and contact area.

2. A method of forming an electrical bonding interconnect to a substrate comprising the following steps:

providing an electrically conductive metal contact area on a substrate;

exposing the metal contact area to conditions effective to reactively form an electrically resistive metal oxide material from the metal;

applying an electrically conductive epoxy over the electrically resistive oxide material, the conductive epoxy comprising a resin component and a hardener component, the hardener component comprising a reducing agent effective to reduce the metal oxide back to conductive metal;

reducing the metal oxide back to conductive metal using the reducing agent present in the hardener component of the conductive epoxy; and curing the conductive epoxy into a conductive hardened material to form a conductive interconnect between the epoxy and contact area.

3. A method of forming an electrical bonding interconnect to a substrate comprising the following steps:

providing a copper metal contact area on a substrate;

exposing the copper contact area to conditions effective to reactively form an electrically resistive copper oxide from the copper;

applying an electrically conductive epoxy over the electrically resistive oxide material, the epoxy comprising at least one of an alkoxylated polyalkyl amine or ethylene diamine;

reducing the copper oxide back to conductive copper metal using the at least one of the alkoxylated polyalkyl amine or ethylene diamine present in the conductive epoxy; and curing the conductive epoxy into a conductive hardened material to form a conductive interconnect between the epoxy and contact area.

* * * * *